United States Patent
Sugai (10) Patent No.: US 9,280,173 B2
(45) Date of Patent: Mar. 8, 2016

(54) ELECTRONIC DEVICE

(71) Applicant: Kabushiki Kaisha Toshiba, Tokyo (JP)

(72) Inventor: Takahiro Sugai, Kokubunji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 167 days.

(21) Appl. No.: 14/250,189

(22) Filed: Apr. 10, 2014

(65) Prior Publication Data

US 2015/0009609 A1 Jan. 8, 2015

Related U.S. Application Data (63) Continuation of application No. PCT/JP2013/068438, filed on Jul. 4, 2013.

(51) Int. Cl.
*H05K 1/00* (2006.01)
*G06F 1/16* (2006.01)
*G06F 1/18* (2006.01)
*G06F 1/20* (2006.01)

(52) U.S. Cl.
CPC ............... *G06F 1/16* (2013.01); *G06F 1/1658* (2013.01); *G06F 1/185* (2013.01); *G06F 1/203* (2013.01)

(58) Field of Classification Search
CPC .................... H05K 1/111; H05K 2201/09036; H05K 2201/10515; H05K 1/0271; H04M 1/026
See application file for complete search history.

(56) References Cited

U.S. PATENT DOCUMENTS

| | | | |
|---|---|---|---|
| 5,644,163 A | 7/1997 | Tsuji | |
| 6,307,748 B1 * | 10/2001 | Lin | H01L 23/4093 165/80.3 |
| 6,654,254 B2 * | 11/2003 | Szu | H01L 23/4093 24/458 |
| 7,397,669 B2 * | 7/2008 | Kiryu | H05K 7/1061 361/679.01 |
| 7,870,888 B2 * | 1/2011 | Zhou | H01L 23/4006 165/80.3 |

(Continued)

FOREIGN PATENT DOCUMENTS

JP H 07221218 8/1995
JP 11-150219 6/1999

(Continued)

OTHER PUBLICATIONS

International Search Report from corresponding PCT/JP2013/068438 application mailed Apr. 7, 2013.

(Continued)

*Primary Examiner* — Tuan T Dinh
*Assistant Examiner* — Hung Dang
(74) *Attorney, Agent, or Firm* — Rutan & Tucker, LLP; William W. Schaal (57) ABSTRACT

According to one embodiment, electronic device includes first board, second board, first component, and second component. The first board includes first and second faces and to which opening and cutout portion is provided. The opening penetrates through the first board. The cutout portion extends to side separating from center of the opening at edge of the opening. The second board includes third and fourth faces. The second board overlaps the first board and is electrically connected to the first board in state in which the fourth face and the first face face each other. The second board covers the opening. The first electronic component is provided to the third face, and electrically connected to the second board. The second component is provided to the fourth face and electrically connected to the second board in state in which at least portion of the second component is held in the opening.

8 Claims, 5 Drawing Sheets

(56) References Cited

U.S. PATENT DOCUMENTS

| | | | |
|---|---|---|---|
| 2001/0000925 A1* | 5/2001 | Caletka | H01L 23/49816 257/738 |
| 2007/0096286 A1 | 5/2007 | Hino | |
| 2007/0223197 A1* | 9/2007 | Xia | H01L 23/4093 361/719 |
| 2008/0291622 A1* | 11/2008 | Wang | H05K 7/1061 361/679.54 |
| 2011/0075370 A1 | 3/2011 | Abe et al. | |
| 2011/0157832 A1 | 6/2011 | Hongo | |
| 2011/0291694 A1 | 12/2011 | Kozai et al. | |

FOREIGN PATENT DOCUMENTS

| | | |
|---|---|---|
| JP | 2001024290 | 1/2001 |
| JP | 2005-129570 | 5/2005 |
| JP | 2005-322844 | 11/2005 |
| JP | 2007123457 | 5/2007 |
| JP | 2007-242890 | 9/2007 |
| JP | 2007-299887 | 11/2007 |
| JP | 2008-010768 | 1/2008 |
| JP | 2009-151367 | 7/2009 |
| JP | 2010-021379 | 1/2010 |
| JP | 2011-077337 | 4/2011 |
| JP | 2011-138958 | 7/2011 |
| JP | 2011138959 | 7/2011 |
| JP | 2011-250220 | 12/2011 |

OTHER PUBLICATIONS

Japanese Patent Application No. 2013-551824, Notice of Rejection, mailed Sep. 24, 2014, (with English Translation).

* cited by examiner

ELECTRONIC DEVICE

CROSS-REFERENCE TO RELATED APPLICATIONS

This application is a continuation of international application No. PCT/JP2013/068438, filed on Jul. 4, 2013, which designates the United States, the entire contents of which are incorporated herein by reference.

FIELD

Embodiments described herein relate generally to an electronic device.

BACKGROUND

Conventionally, there has been known an electronic device comprising a package mounted to a first circuit board held inside a housing. Here, the package comprises a second circuit board and an electronic component.

An electronic device preferably has a configuration with less inconvenience in mounting a package having a novel component layout on a circuit board, for example.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, an electronic device comprises a first circuit board, a second circuit board, a first electronic component, and a second electronic component. The first circuit board comprises a first face and a second face opposite the first face and to which an opening and a cutout portion is provided. The opening penetrates through the first circuit board between the first face and the second face. The cutout portion extends to aside separating from a center of the opening at an edge of the opening. The second circuit board comprises a third face and a fourth face opposite the third face. The second circuit board overlaps the first circuit board and is electrically connected to the first circuit board in a state in which the fourth face and the first face face each other. The second circuit board covers the opening. The first electronic component is provided to the third face, and electrically connected to the second circuit board. The second electronic component is provided to the fourth face and electrically connected to the second circuit board in a state in which at least a portion of the second electronic component is held in the opening.

Exemplary embodiments and modifications below comprise the same or similar constituent components. Hereinafter, common reference numerals denote the same or similar constituent components and overlapped description thereof is omitted. The portions that are comprised in the respective embodiment and modifications can be configured by being replaced by corresponding portions in other embodiment and modifications.

Although the following embodiment and modifications describe the case where an electronic device is configured as a clamshell-type (notebook-type, folding-type) personal computer, the electronic device according to the embodiment is not limited thereto. For example, the electronic device according to the embodiment can be configured as electronic devices comprising a circuit board to which a package is mounted, such as tablet-type (slate-type) or desktop personal computers, smartphones, phablets, mobile phones, personal digital assistants (PDAs), electronic book terminals, video image display devices, television receivers, videophones, game machines, video image display control devices, and information storage devices.

Embodiment

Figure 1:
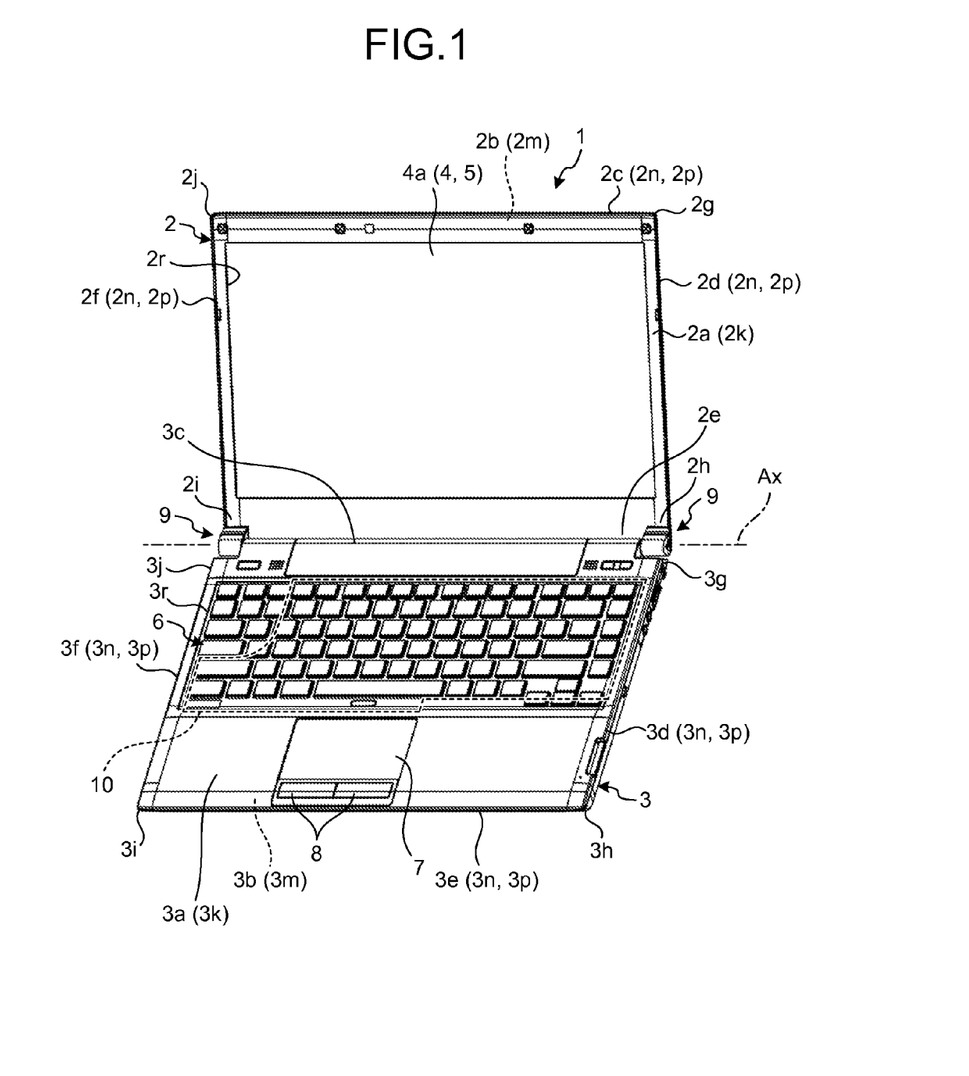
FIG. 1 is an exemplary perspective view of an electronic device according to an embodiment.

In the embodiment, as illustrated in FIG. 1, an electronic device 1 comprises a housing 2 (first housing, first part) and a housing 3 (second housing, another housing, second part). The housing 2 supports a display device 4. The housing 3 accommodates a circuit board 10. The housing 3 is provided with a keyboard 6, a touch pad 7, click buttons 8, and the like. The keyboard 6, the touch pad 7, the click buttons 8, and the like are examples of input modules, input receivers, and input operation modules. Furthermore, the touch pad 7, the click buttons 8, and the like are examples of pointing devices.

The housing 2 and the housing 3 are connected to each other by hinge portions 9 (connecting portions, rotational movement support portions, hinge mechanisms) in a rotationally movable manner. The housing 2 and the housing 3 are connected to each other in the rotationally movable manner between at least an opened state as illustrated in FIG. 1 and a folded state (not illustrated) by the hinge portions 9. In the embodiment, the hinge portions 9 connect the housing 2 and the housing 3 with each other in the rotationally movable manner about a rotating axis Ax. A display screen 4*a* of the display device 4 can be checked visually through an opening 2*r* provided on a face 2*a* of the housing 2. The keyboard 6, the touch pad 7, the click buttons 8, and the like are exposed onto a face 3*a* of the housing 3. In the folded state, the face 3*a* of the housing 3 and the face 2*a* of the housing 2 are superimposed with each other, so that the display screen 4*a*, the keyboard 6, the touch pad 7, the click buttons 8, and the like are hidden by the housing 2 and the housing 3. In the opened state, the face 3*a* of the housing 3 and the face 2*a* of the housing 2 are exposed, so that the display screen 4*a*, the keyboard 6, the touch pad 7, the click buttons 8, and the like can be used (can be checked visually or can be operated).

As illustrated in FIG. 1, in the embodiment, the housing 2 has a quadrangular outer shape (in the embodiment, rectangular outer shape that is long in the lateral direction, as an example) when viewed from the front side and the rear side, for example. The housing 2 has a flattened rectangular parallelepiped shape that is thin in the front and rear direction (thickness direction of the housing 2). The housing 2 comprises the face 2a (front face, anterior face, face portion), a face 2b (rear face, posterior face, face portion) at the side opposite the face 2a, and faces 2p (side faces, face portions) connecting the face 2a and the face 2b. Both of the face 2a and the face 2b intersect with the thickness direction of the housing 2. The face 2a and the face 2b are substantially parallel with each other. The faces 2a and 2b intersect with (in the embodiment, are orthogonal to, as an example) the faces 2p. The face 2a and the faces 2p, the face 2b and the faces 2p, and the faces 2p are not necessarily distinguished from each other by sharpened corners or the like clearly and may be connected to each other through bent portions or the like smoothly. The housing 2 comprises four ends 2c to 2f (sides, edges, peripheral edges) and four corners 2g to 2j (sharp portions, bent portions, ends) when viewed from the front side. The ends 2c and 2e are examples of long sides. The ends 2d and 2f are examples of short sides.

Furthermore, the housing 2 comprises a wall 2k (portion, plate, anterior wall, face wall, ceiling wall, first wall portion), a wall 2m (portion, plate, posterior wall, back wall, bottom wall, second wall), and walls 2n (portions, plates, side walls, end walls, standing walls, connecting portions, third walls). The wall 2k comprises the face 2a. The wall 2m comprises the face 2b. The walls 2n comprise the faces 2p. All of the walls 2k, 2m, and 2n are quadrangular (in the embodiment, rectangular, as an example). Furthermore, all of the walls 2k, 2m, and 2n are formed into a plate-like form. The wall 2k and the walls 2n, the wall 2m and the walls 2n, and the walls 2n are not necessarily distinguished from each other by sharpened corners or the like clearly and may be connected to each other through bent portions or the like smoothly. The opening 2r having the quadrangular shape is provided to the wall 2k. The housing 2 can be made of a metal material, a synthetic resin material, or the like. The metal material can be formed by casting, pressing, cutting, or the like. The synthetic resin material can be formed by injection molding or the like. The housing 2 can comprise a plurality of members (components, divided members).

In the embodiment, the housing 2 supports the display device 4 (display module, display, panel, display component). In the embodiment, the housing 2 accommodates therein at least a portion of the display device 4. The display screen 4a is exposed from the opening 2r provided to the wall 2k. The display device 4 has a quadrangular outer shape (in the embodiment, rectangular outer shape, as an example) when viewed from the front side. The display device 4 has a flattened rectangular parallelepiped shape that is thin in the front and rear direction (thickness direction of the housing 2, thickness direction of the display device 4). For example, the display device 4 is a liquid crystal display (LCD) or an organic electroluminescent display (OELD). The display device 4 may be a flexible display.

In the embodiment, a quadrangular input operation panel 5 (touch panel, touch sensor, operation surface, input operation module, input receiver) that is transparent and relatively thin is provided at the anterior side (front side, wall 2k side) of the display device 4. The input operation panel 5 covers the display screen 4a. An operator (user or the like) performs an operation on the input operation panel 5 with his (her) hand or finger, a stylus, or the like so as to execute input processing. The operation to be performed by the operator includes touching, pressing, sliding, or moving his (her) hand or finger, the stylus, or the like in the vicinity of the input operation panel 5. Light emitted from the display screen 4a of the display device 4 passes through the input operation panel 5 so as to travel to the front side (outer side) of the housing 2 through the opening 2r of the wall 2k. The input operation panel 5 is an example of an input module. In the embodiment, the display device 4 and the input operation panel 5 are fixed to (supported on) the housing 2 through a coupling tool (coupling component, fixing component, for example, screw, clasp, component, not illustrated) or an adhesion portion (for example, adhesive, double-sided tape, not illustrated), as an example. The input operation panel 5 can be configured as an in-cell touch panel incorporated in the display device 4.

In the embodiment, as illustrated in FIG. 1, the housing 3 has a quadrangular outer shape (in the embodiment, rectangular outer shape that is long in the lateral direction, as an example) when viewed from the front side and the rear side, for example. The housing 3 has a flattened rectangular parallelepiped shape that is thin in the up and down direction (thickness direction of the housing 3). The housing 3 comprises the face 3a (front face, upper face, face portion), a face 3b (rear face, lower face, face portion) at a side opposite the face 3a, and faces 3p (side faces, face portions) connecting the face 2a and the face 2b with each other. Both of the face 3a and the face 3b intersect with the thickness direction of the housing 3. The face 3a and the face 3b are substantially parallel with each other. The faces 3a and 3b intersect with (in the embodiment, are orthogonal to, as an example) the faces 3p. The face 3a and the faces 3p, the face 3b and the faces 3p, and the faces 3p are not necessarily distinguished from each other by sharpened corners or the like clearly and may be connected to each other through bent portions or the like smoothly. The housing 3 comprises four ends 3c to 3f (sides, edges, peripheral edges) and four corners 3g to 3j (sharp portions, bent portions, ends) when viewed from the front side. The ends 3c and 3e are examples of long sides. The ends 3d and 3f are examples of short sides.

Furthermore, the housing 3 comprises a wall 3k (portion, plate, upper wall, face wall, ceiling wall, first wall), a wall 3m (portion, plate, lower wall, back wall, bottom wall, second wall), and walls 3n (portions, plates, side walls, end walls, standing walls, connecting portions, third walls). The wall 3k comprises the face 3a. The wall 3m comprises the face 3b. The walls 3n comprise the faces 3p. All of the walls 3k, 3m, and 3n are quadrangular (in the embodiment, rectangular, as an example). Furthermore, all of the walls 3k, 3m, and 3n are formed into a plate-like form. The wall 3k and the walls 3n, the wall 3m and the walls 3n, and the walls 3n are not necessarily distinguished from each other by sharpened corners or the like clearly and may be connected to each other through bent portions or the like smoothly. An opening 3r having a quadrangular shape is provided to the wall 3k. The housing 3 can be made of a metal material, a synthetic resin material, or the like. The metal material can be formed by casting, pressing, cutting, or the like. The synthetic resin material can be formed by injection molding or the like. The housing 3 can comprise a plurality of members (components, divided members).

In the embodiment, the housing 3 accommodates therein at least one circuit board 10 (substrate, component, electric component, substrate assembly, first circuit board). The circuit board 10 is provided in parallel with the keyboard 6. The circuit board 10 is fixed to the housing 3 by a coupling tool (for example, screw, nut, stand, not illustrated), a claw, or the like.

In the embodiment, a plurality of components (electronic components, semiconductor electronic components, electric components) such as a central processing unit (CPU), a graphic controller, a power supply circuit component, a platform controller hub (PCH), a memory slot connector, an LCD connector, an input/output (I/O) connecter, a power supply coil, an element, and a connector can be mounted on the circuit board 10, for example. A control circuit (not illustrated) configured on the circuit board 10 can comprise a video image signal processing circuit, a tuner module, a high-definition multimedia interface (HDMI, registered trademark) signal processor, an audio video (AV) input terminal, a remote control signal receiver, a controller, a selector, an on-screen display interface, a storage module (for example, read only memory (ROM), random access memory (RAM), hard disk drive (HDD), solid state drive (SSD)), and an audio signal processing circuit, for example. The control circuit controls output of a video image (moving image, still image, and the like) from the display screen 4a of the display device 4, output of audio from a speaker (not illustrated), light emission from a light-emitting diode (LED, not illustrated), and the like. The display device 4, the speaker, the LED, and the like are examples of output modules.

Figure 2:
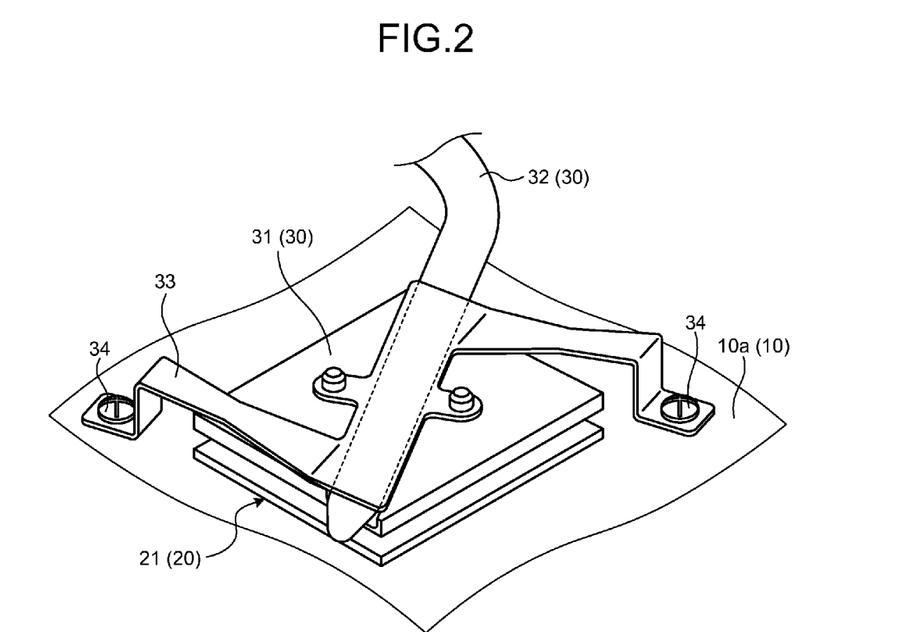
FIG. 2 is an exemplary perspective view of a package mounted to a first circuit board of the embodiment.
Figure 3:
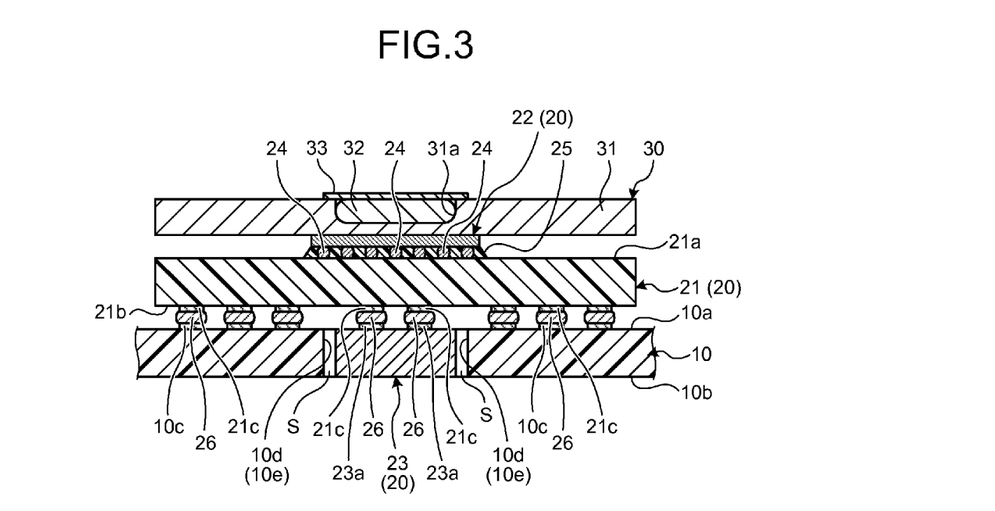
FIG. 3 is an exemplary cross-sectional view of the package mounted to the first circuit board of the embodiment.

In the embodiment, as illustrated in FIGS. 2 and 3, a package 20 as one component is surface-mounted on a face 10a (first face) of the circuit board 10. The package 20 is a CPU, for example. The package 20 can be also mounted on a face 10b (second face) of the circuit board 10 at the side opposite the face 10a. The package 20 comprises a circuit board 21 (interposer, substrate, package substrate, second circuit board), an electronic component 22 (element, component, electric component, first electronic component), and an electronic component 23 (element, component, electric component, second electronic component). In the embodiment, the package 20 is configured as a flip chip-ball grid array (FC-BGA), for example. The configuration of the package 20 is not limited to FC-BGA and the package 20 may have another configuration including the circuit board 21 and the electronic components 22 and 23.

In the embodiment, as illustrated in FIGS. 2 and 3, a heat sink 31 is located above the package 20, that is, on the package 20 at the side opposite the circuit board 10. A heat pipe 32 makes contact with the heat sink 31. In the embodiment, a recess 31a is provided to the heat sink 31, for example. The recess 31a accommodates therein the heat pipe 32. A pressing member 33 presses the heat sink 31 and the heat pipe 32 toward the electronic component 22 of the package 20 elastically. The pressing member 33 is fixed to the circuit board 10 by coupling tools 34 such as screws, stubs, and nuts, for example.

For example, the heat sink 31 is a plat-like or block-like member made of a metal material (for example, aluminum alloy) having relatively high heat dissipation property. The heat sink 31 can comprise a plurality of projections (not illustrated). The projections are fins or protrusions, for example. The heat sink 31 can be provided with a plurality of openings (not illustrated). The openings are recesses, grooves, or through-holes, for example. Another member (not illustrated) having fins or protrusions may be attached to the heat sink 31 at the side opposite the package 20. A sheet-like heat transfer member (not illustrated) having elasticity (flexibility) may be provided to the heat sink 31 at the package 20 side. The heat pipe 32 is a pipe made of a metal material (for example, copper alloy) having relatively high heat dissipation property, for example. A heat transport medium is injected into the heat pipe 32. For example, the pressing member 33 is a plate-like member formed by an elastic member such as stainless steel and spring steel. The pressing member 33 is configured by performing press molding, folding molding, and the like on the plate-like member. Heat generated on the package 20 is transferred to the heat pipe 32 through the heat sink 31. Then, the heat transport member transports the heat from one end connected to the heat sink 31 to the other end connected to the fins (not illustrated) in the heat pipe 32. The heat is dissipated from the fins. Airflow generated by rotation of a fan (not illustrated) hits the fins. Furthermore, the pressing member 33 also has heat transfer property. In the embodiment, the heat sink 31, the heat pipe 32, the pressing member 33, the fins, the fan, and the like are constituent components of a heat dissipation mechanism 30. The heat sink 31 is an example of a heat dissipation member and is an example of a heat receiver of the heat dissipation mechanism 30. The heat pipe 32 is an example of a heat transport portion of the heat dissipation mechanism 30. The fins are examples of a heat dissipation portion of the heat dissipation mechanism 30. The pressing member 33 presses the heat sink 31 and the heat pipe 32 against the electronic component 22 of the package 20. With this, the heat sink 31 or the heat pipe 32 and the electronic component 22 can be made to adhere to each other reliably or in a more appropriate posture, for example. This can suppress lowering of heat dissipation performance due to contact failure between the heat sink 31 or the heat pipe 32 and the electronic component 22, for example.

The circuit board 21 comprises a face 21a (third face) and a face 21b (fourth face) at the side opposite the face 21a. A base of the circuit board 21 can be made of a synthetic resin material having insulating property, ceramic, or the like, as an example. The face 21a or 21b of the circuit board 21 or an inner portion of the circuit board 21 comprises conductors 21c (conductive patterns, pads, wiring layers, or the like). The circuit board 21 can be a built-up substrate, a coreless substrate, or the like. Furthermore, the circuit board 21 can be a rigid substrate, a flexible substrate, or the like. The circuit board 21 can be provided with a through hole, a via, a through-electrode, or the like.

The electronic component 22 (die, core, controller, module, active component, or the like, first electronic component) is mounted to the face 21a (third face). (A conductor of, not illustrated) the electronic component 22 and (a conductor of, not illustrated) the circuit board 21 are mechanically and electrically connected to each other through conductors 24 (solder balls, soldering balls, bumps, conductive pastes, bonding portions, connecting portions). It is to be noted that the electronic component 22 and the circuit board 21 may be electrically connected to each other through a wire (bonding wire) as a conductor.

A cover 25 (sealing member) covers (the face 21a) of the circuit board 21 and the electronic component 22. The cover 25 can be made of a synthetic resin material having insulating property, as an example. The cover 25 assumes a role of protecting and insulating the electronic component 22.

The electronic component 23 (die, core, controller, module, active component, or the like, second electronic component) is mounted to the face 21b (fourth face). (Conductors 23a) of the electronic component 23 and (the conductors 21c) of the circuit board 21 are mechanically and electrically connected to each other through conductors 26.

The conductors 21c of the circuit board 21 and conductors 10c of the circuit board 10 are mechanically and electrically connected to each other through conductors 26 (solder balls, soldering balls, bumps, conductive pastes, bonding portions, connecting portions). In the embodiment, as illustrated in FIGS. 3 and 4, the conductors 26 are arranged between the face 10a of the circuit board 10 and the face 21b of the circuit board 21 in a matrix form (grid-point form) in a dispersed manner, for example.

The conductor (not illustrated) of the electronic component 22 and the conductors 10c of the circuit board 10 are electrically connected to each other through the conductors 24, the conductors 21c of the circuit board 21, and the conductors 26. Note that the conductors 24 are interposed between the electronic component 22 and the circuit board 21. The conductors 24 bond the conductor of the electronic component 22 and the conductor of the circuit board 21 by being cooled after melt by reflow processing, for example. The conductors 26 bond the conductors 10c and the conductors 21c, and the conductors 21c and the conductors 23a by being cooled after melt by the reflow processing, for example.

Figure 4:
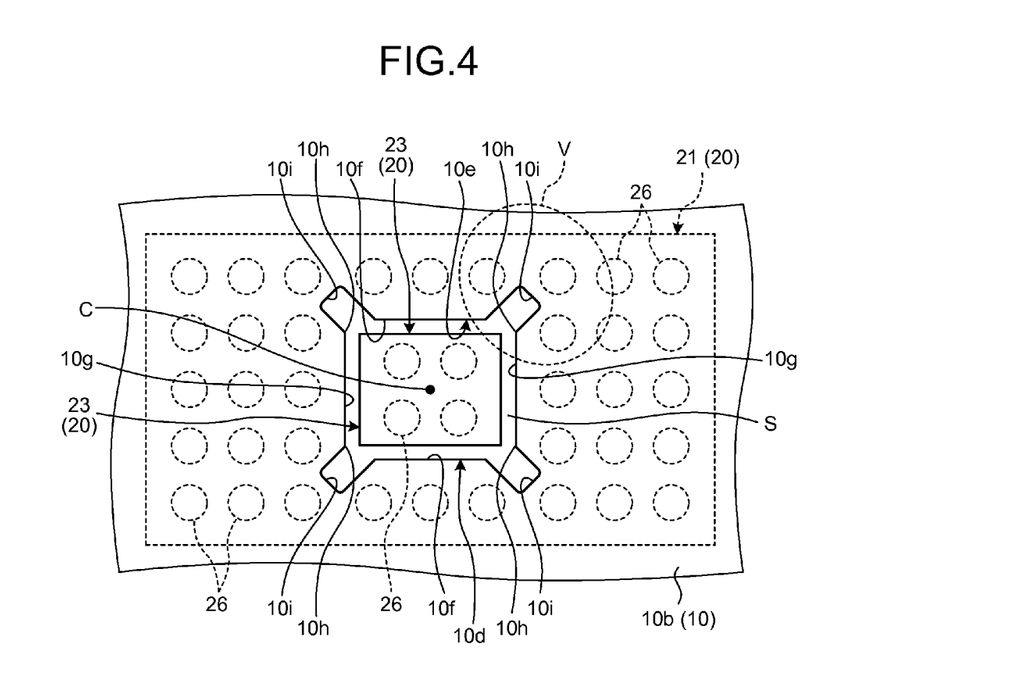
FIG. 4 is an exemplary plan view of the first circuit board to which the package is mounted when viewed from the side opposite a face to which the package is mounted, of the embodiment.

In the embodiment, as illustrated in FIGS. 3 and 4, an opening 10d (through-hole) that penetrates through the circuit board 10 between the face 10a and the face 10b is provided to the circuit board 10. An edge 10e of the opening 10d is formed into a quadrangular shape (rectangular shape) comprising a pair of sides 10f (long sides), a pair of sides 10g (short sides), and four corners 10h.

As illustrated in FIGS. 3 and 4, the opening 10d accommodates therein at least a portion of (in the embodiment, overall, as an example) the electronic component 23 of the package 20. A space S is formed between the edge 10e of the opening 10d and the electronic component 23. The opening 10d suppresses interference between the electronic component 23 and the circuit board 10.

As illustrated in FIG. 4, cutout portions 10i are formed on the edge 10e of the opening 10d. The cutout portions 10i extend (project) to the sides separated from a center C of the opening 10d. The cutout portion(s) 10i is (are) provided to at least one corner 10h (in the embodiment, all the four corners 10h, as an example). Furthermore, the cutout portions 10i are provided to both ends of the sides 10f (long sides) and sides 10g (short sides). Each cutout portion 10i extends (projects) along the direction intersecting with both the two sides 10f and 10g adjacent to each corner 10h, that is, the direction that is substantially along a diagonal line of the opening 10d having the quadrangular shape.

Figure 5:
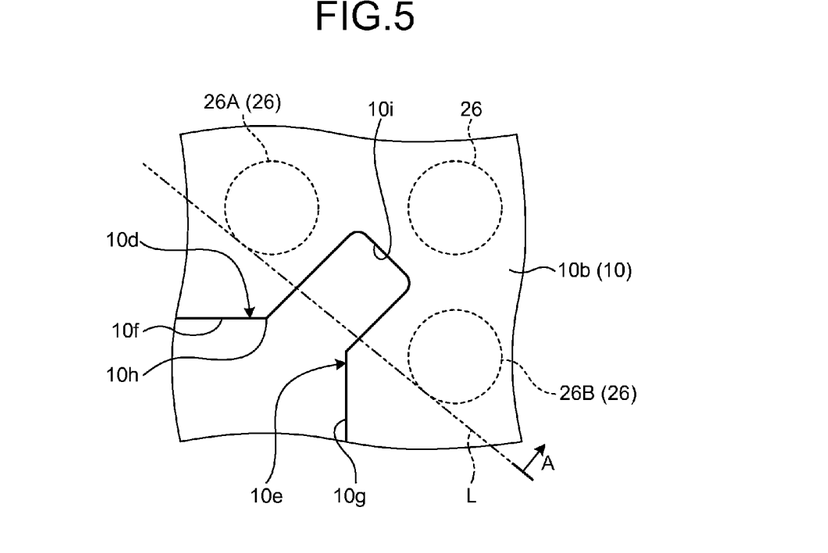
FIG. 5 is an exemplary enlarged view of a V portion in FIG. 4 of the embodiment.

As illustrated in FIG. 5, each cutout portion 10i is located between two conductors 26A and 26B (26) that are adjacent to the opening 10d and are adjacent to each other in a sight line (when viewed from the above, sight line of FIG. 5) of a direction (thickness direction of the circuit board 10) orthogonal to the faces 10a and 10b. Furthermore, each cutout portion 10i extends to a far side (upper right side, in a region A in FIG. 5) from the center C (see FIG. 4, not illustrated in FIG. 5, located at the lower left side in FIG. 5) of the opening 10d with respect to a position overlapping an external common tangential line L of the two conductors 26A and 26B at a side closer to the center C when viewed from the above.

As described above, in the embodiment, for example, the cutout portions 10i are provided to the edge 10e of the opening 10d of the circuit board 10 (first circuit board) . In the embodiment, the cutout portions 10i are provided, so that the periphery of the opening 10d is easy to be deformed in comparison with the configuration in which the cutout portions 10i are not provided, for example. According to the embodiment, for example, when a force acts on the periphery of the opening 10d, local action of load based on the force on the circuit board 10 is easy to be suppressed. This makes it easy to suppress increase in the load that acts on specific conductors 26 (for example, conductors 26 closer to the corners 10h of the opening 10d) among the conductors 26, for example. The force acting on the periphery of the opening 10d includes a pressing force by the pressing member 33. As described above, the pressing force is generated by the pressing member 33 so as to transfer the heat generated by the electronic component 22 (first electronic component), the electronic component 23 (second electronic component), and the like more reliably or more efficiently by the heat dissipation mechanism 30. According to the embodiment, for example, lowering of the heat dissipation performance by the electronic components 22 and 23 is easy to be suppressed and local action of the load on the periphery of the opening 10d of the circuit board 10 is easy to be suppressed. Furthermore, for example, the circuit board 10 is easy to be deformed, so that when there is a difference in a linear expansion coefficient between the circuit board 10 and the package 20, a stress generated on the conductors 26 by heat of the electronic components 22 and 23, and the like, or heat from other sites is easy to be suppressed.

Furthermore, in the embodiment, the cutout portion (s) 10i is (are) provided to at least one (in the embodiment, four, as an example) corner 10h of the opening 10d having the quadrangular shape, for example. According to the embodiment, for example, local action of the load on the region(s) (periphery of the opening 10d) along the side(s) 10f and/or 10g adjacent to the corner(s) 10h is easy to be suppressed.

In the embodiment, for example, each cutout portion 10i provided to the corner 10h extends in the direction (oblique direction, direction that is substantially along an extended line of a diagonal line of the opening 10d) intersecting with both the two sides 10f and 10g adjacent to the corner 10h. According to the embodiment, for example, local action of the load on both the region (peripheral edge of the opening 10d) along the side 10f adjacent to the corner 10h and the region (periphery of the opening 10d) along the side 10g adjacent to the corner 10h is easy to be suppressed with the relatively small cutout portion 10i.

Furthermore, in the embodiment, for example, the cutout portions 10i are provided at both ends of at least one (in the embodiment, four, as an example) of the sides 10f and 10g. According to the embodiment, for example, the region(s) (peripheral edge of the opening 10d) along the side (s) 10f and/or the side(s) 10g is (are) easy to be deformed in comparison with the configuration in which the cutout portions 10i are not provided. According to the embodiment, for example, local action of the load on the region(s) along the side(s) 10f and/or the side(s) 10g is easy to be suppressed.

In the embodiment, for example, as illustrated in FIG. 5, each cutout portion 10i extends to the far side (upper right side, in the region A in FIG. 5) from the center C (see, FIG. 4) of the opening 10d with respect to the position overlapping the common external tangential line L of the two conductors 26A and 26B when viewed from the above. With this, the above-mentioned effects with the cutout portion 10i are easy to be obtained in comparison with the case where the cutout portion 10i is short.

First Modification

Figure 6:
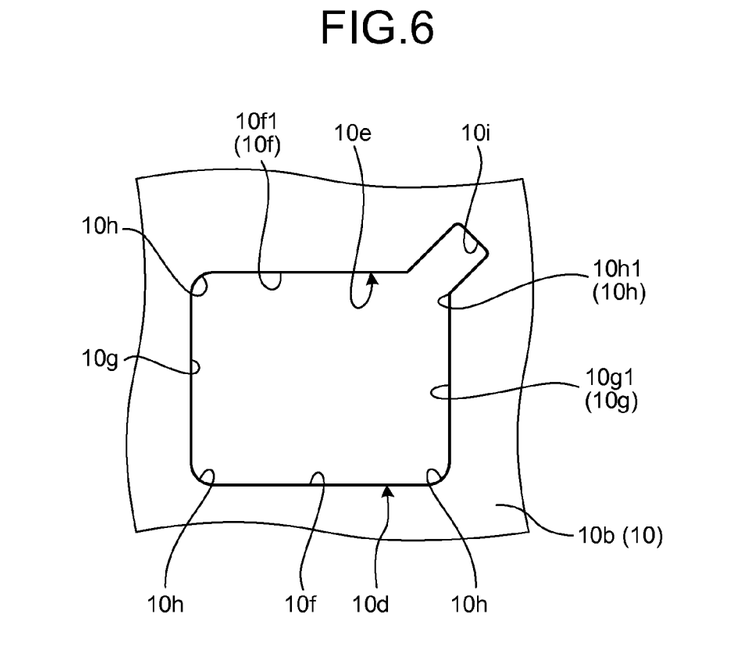
FIG. 6 is an exemplary plan view of an opening of a first circuit board when viewed from a side opposite a face to which a package is mounted, of a first modification.

An electronic device 1 according to the modification has the same configuration as the above-mentioned embodiment other than a point that the shape of the opening 10d as illustrated in FIG. 6 is different. According to the modification, the same effects (results) as those obtained in the above-mentioned embodiment based on the same configuration are also obtained.

In the modification, as illustrated in FIG. 6, the cutout portion 10*i* is provided to only one corner 10*h*1 of the opening 10*d* having the quadrangular shape. With this configuration, regions (periphery of the opening 10*d*) along sides 10*f*1 and 10*g*1 adjacent to (the corner 10*h*1 provided with) the cutout portion 10*i* are easy to be deformed in comparison with the configuration in which the cutout portion 10*i* is not provided. According to the modification, for example, local action of load on the regions along the side 10*f*1 and the side 10*g*1 adjacent to the cutout portion 10*i* is easy to be suppressed. This configuration is effective in the case where a force does not act on four sides 10*f* and 10*g* uniformly (the force does not act symmetrically with respect to the center C (see FIG. 4) of the opening 10*d*), the case where it is difficult to provide the cutout portions 10*i* on all the four corners 10*h*, and the like, in some cases.

Second Modification

Figure 7:
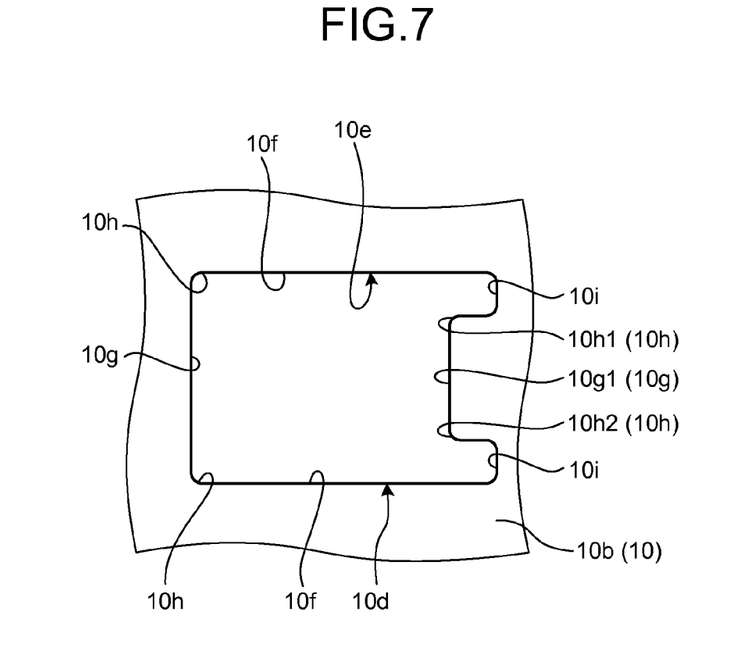
FIG. 7 is an exemplary plan view of an opening of a first circuit board when viewed from a side opposite a face to which a package is mounted, of a second modification.

An electronic device 1 according to the modification has the same configuration as the above-mentioned embodiment other than a point that the shape of the opening 10*d* as illustrated in FIG. 7 is different. According to the modification, the same effects (results) as those obtained in the above-mentioned embodiment based on the same configuration are also obtained.

In the modification, as illustrated in FIG. 7, the cutout portions 10*i* are provided to two corners 10*h*1 and 10*h*2 at both ends of one side 10*g*1 (short side) of the opening 10*d* having the quadrangular shape. With this configuration, a region (periphery of the opening 10*d*) along the side 10*g*1 is easy to be deformed in comparison with the configuration on which the cutout portions 10*i* are not provided. According to the modification, for example, local action of load on the region along the side 10*g*1 between the two cutout portions 10*i* is easy to be suppressed. In general, the regions along the sides 10*g* (short sides) are more difficult to be deformed than the regions along the sides 10*f* (long sides). Based on this, according to the modification, for example, local action of load is easy to be suppressed more effectively by the smaller number of cutout portions 10*i* in some cases.

Third Modification

Figure 8:
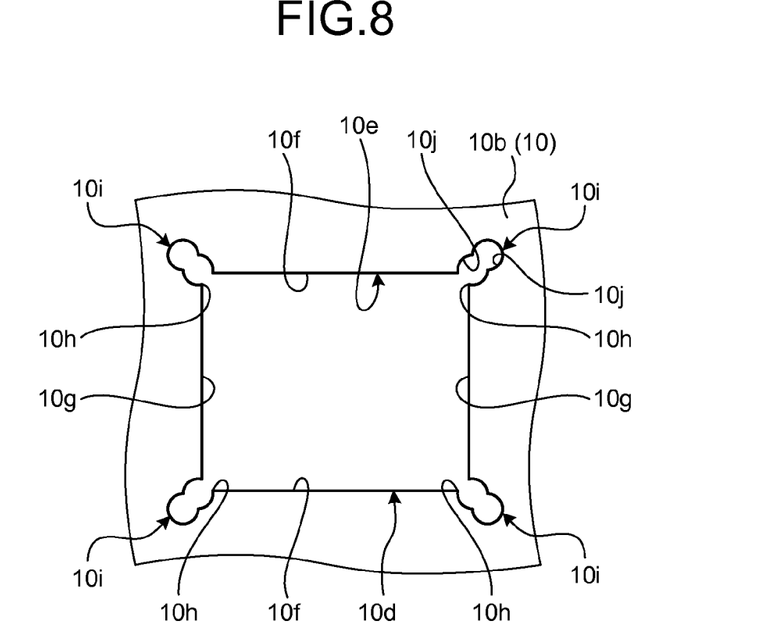
FIG. 8 is an exemplary plan view of an opening of a first circuit board when viewed from a side opposite a face to which a package is mounted, of a third modification.

An electronic device 1 according to the modification has the same configuration as the above-mentioned embodiment other than a point that the shape of the opening 10*d* as illustrated in FIG. 8 is different. According to the modification, the same effects (results) as those obtained in the above-mentioned embodiment based on the same configuration are also obtained.

In the modification, as illustrated in FIG. 8, two openings 10*j* (through-holes) are coupled to constitute each cutout portion 10*i*. Both of the two openings 10*j* can be formed on the circuit board 10 by using a drill. According to the modification, for example, the cutout portions 10*i* can be formed more easily in some cases.

Fourth Modification

Figure 9:
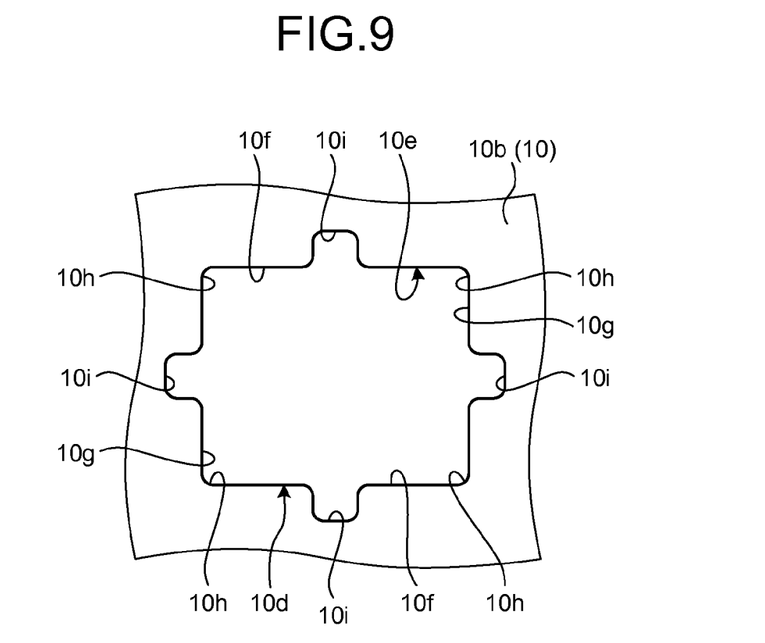
FIG. 9 is an exemplary plan view of an opening of a first circuit board when viewed from a side opposite a face to which a package is mounted, of a fourth modification.

An electronic device 1 according to the modification has the same configuration as the above-mentioned embodiment other than a point that the shape of the opening 10*d* as illustrated in FIG. 9 is different. According to the modification, the same effects (results) as those obtained in the above-mentioned embodiment based on the same configuration are also obtained.

In the modification, as illustrated in FIG. 9, the cutout portions 10*i* are provided to intermediate portions (sites separated from the corners 10*h*) of the sides 10*f* and 10*g*. According to the modification, for example, local action of load is easy to be suppressed more efficiently in some cases depending on positions on which a force acts.

Hereinbefore, the exemplary embodiment and modifications of the invention have been described but the above-mentioned embodiment and modifications are merely examples and do not intend to limit the range of the invention. These embodiment and modifications can be executed in various other modes and various omissions, replacements, combinations and changes can be made in a range without departing from the scope of the invention. The embodiment and modifications are encompassed in the range and scope of the invention and are encompassed in the invention described in the scope of the accompanying claims and equivalents thereof. Partial replacement of the components between the embodiment and the modifications can be made. The respective constituent components can be made to function while changing the specifications (configurations, types, directions, shapes, sizes, lengths, widths, thicknesses, heights, numbers, arrangement, positions, materials, and the like) thereof appropriately. For example, the shape of the opening may be a shape (for example, square) other than the rectangular shape.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a first circuit board comprising a first face and a second face opposite the first face and to which an opening and a cutout portion is provided, the opening penetrating through the first circuit board between the first face and the second face, the cutout portion extending to a side separating from a center of the opening at an edge of the opening;
   a second circuit board comprising a third face and a fourth face opposite the third face, the second circuit board overlapping the first circuit board and being electrically connected to the first circuit board in a state in which the fourth face and the first face face each other, the second circuit board covering the opening;
   a first electronic component provided to the third face, and electrically connected to the second circuit board; and
   a second electronic component provided to the fourth face and electrically connected to the second circuit board in a state in which at least a portion of the second electronic component is held in the opening.

2. The electronic device of claim 1, wherein
   the opening is formed in a quadrangular shape comprising four corners; and
   the cutout portion is provided to at least one of the corners.

3. The electronic device of claim 1, wherein
   the opening is formed in a quadrangular shape comprising four corners and four sides; and
   the cutout portion is provided to at least one of the corners and extends in a direction intersecting both of two of the sides that are adjacent to the at least one of the corners.

4. The electronic device of claim 1, wherein
the opening is formed in a quadrangular shape comprising four sides; and
the cutout portion is provided to each of both ends of at least one of the sides.

5. The electronic device of claim 1, wherein
the opening is formed in a rectangular shape comprising a short side and a long side; and
the cutout portion is provided to an end of the short side.

6. The electronic device of claim 1, wherein a plurality of conductors that electrically connect the first circuit board and the second circuit board with each other are arranged between the first face and the fourth face.

7. The electronic device of claim 6, wherein, when viewed in a direction orthogonal to the first face, the cutout portion extends between two conductors adjacent to each other and adjacent to the opening and extends to a far side from the center with respect to a position overlapping an external tangential line of the two conductors at a side near the center of the opening.

8. The electronic device of claim 6, further comprising a pressing member fixed to the first circuit board and pressing the first electronic component against the first circuit board.

* * * * *